(12) United States Patent
Hine et al.

(10) Patent No.: US 10,068,869 B2
(45) Date of Patent: Sep. 4, 2018

(54) MOUNTING STRUCTURE AND BGA BALL

(71) Applicant: Panasonic Intellectual Property Management Co., Ltd., Osaka (JP)

(72) Inventors: Kiyohiro Hine, Osaka (JP); Akio Furusawa, Osaka (JP); Masato Mori, Hyogo (JP); Taichi Nakamura, Osaka (JP); Hidetoshi Kitaura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 392 days.

(21) Appl. No.: 14/880,942

(22) Filed: Oct. 12, 2015

(65) Prior Publication Data

US 2016/0163668 A1    Jun. 9, 2016

(30) Foreign Application Priority Data

Dec. 3, 2014 (JP) ................. 2014-244619

(51) Int. Cl.
| | | |
|---|---|---|
| *H01L 23/00* | (2006.01) | |
| *H01B 1/02* | (2006.01) | |
| *B23K 35/02* | (2006.01) | |
| *B23K 35/26* | (2006.01) | |
| *C22C 13/00* | (2006.01) | |

(52) U.S. Cl.
CPC .......... *H01L 24/17* (2013.01); *B23K 35/0244* (2013.01); *B23K 35/262* (2013.01); *C22C 13/00* (2013.01); *H01B 1/02* (2013.01); *H01L 24/14* (2013.01); *H01L 2924/014* (2013.01); *H01L 2924/0105* (2013.01); *H01L 2924/01029* (2013.01); *H01L 2924/0135* (2013.01); *H01L 2924/01047* (2013.01); *H01L 2924/01049* (2013.01); *H01L 2924/01083* (2013.01)

(58) Field of Classification Search
CPC ... B23K 35/0244; B23K 35/262; H01L 24/14; H01L 24/17; H01L 2924/014; H01L 23/49816
USPC ........................................ 174/257
See application file for complete search history.

(56) References Cited

U.S. PATENT DOCUMENTS 5,998,861 A * 12/1999 Hiruta ................ H01L 21/563
                                                257/700
2003/0089923 A1 * 5/2003 Oida .................. H01L 21/4853
                                                257/200

(Continued)

FOREIGN PATENT DOCUMENTS

| JP | 2007-013099 A | 1/2007 |
|---|---|---|
| JP | 4939891 B | 5/2012 |

(Continued)

*Primary Examiner* — William H Mayo, III
*Assistant Examiner* — Rhadames J Alonzo Miller
(74) *Attorney, Agent, or Firm* — Panasonic IP Management; Kerry S. Culpepper

(57) ABSTRACT

A mounting structure includes a BGA including a BGA electrode, a circuit board including a circuit board electrode, and a solder joining portion which is arranged on the circuit board electrode and is connected to the BGA electrode. The solder joining portion is formed of Cu having a content ratio in a range from 0.6 mass % to 1.2 mass %, inclusive, Ag having a content ratio in a range from 3.0 mass % to 4.0 mass %, inclusive, Bi having a content ratio in a range from 0 mass % to 1.0 mass %, inclusive, In, and Sn. A range of the content ratio of In is different according to the content ratio of Cu.

2 Claims, 3 Drawing Sheets

(56) References Cited

U.S. PATENT DOCUMENTS

| | | | | |
|---|---|---|---|---|
| 2003/0214795 | A1* | 11/2003 | Sakuyama | H01L 24/11 361/767 |
| 2007/0001284 | A1* | 1/2007 | Kim | H01L 21/4846 257/698 |
| 2007/0117265 | A1* | 5/2007 | Masumoto | H01L 24/10 438/108 |
| 2010/0307823 | A1* | 12/2010 | Kawamata | B23K 35/26 174/84 R |
| 2011/0120769 | A1* | 5/2011 | Sakatani | B23K 35/262 174/84 R |
| 2017/0259366 | A1* | 9/2017 | Ishikawa | B23K 1/20 |

FOREIGN PATENT DOCUMENTS

| | | | |
|---|---|---|---|
| WO | 2009/011392 | A1 | 1/2009 |
| WO | 2010/122764 | A1 | 10/2010 |

\* cited by examiner

MOUNTING STRUCTURE AND BGA BALL

BACKGROUND

1. Technical Field

The present disclosure relates to a mounting structure including a circuit board and a Ball Grid Array (BGA) connected to the circuit board, and a BGA ball.

2. Description of the Related Art

Recently, electric control of an automobile has progressed, and thus multiple electronic devices have been mounted on the automobile, and the number of electronic devices has been increased. Accordingly, it is difficult to sufficiently ensure a mounting space for the electronic devices to be mounted on the automobile, and thus the devices are required to be downsized. Therefore, a circuit board has been highly integrated in order to mount a plurality of electronic components having various functions on one circuit board.

According to the highly integrated mounting on the circuit board, integrated circuit components have also been highly integrated. In the related art, in the electronic device to be mounted on the automobile, a Quad Flat Package (QFP) in which terminals are arranged on four sides of the integrated circuit component or the like is mainly adopted. However, the QFP has been restrictively replaced with a BGA according to an increase in the number of signals from the integrated circuit component. The BGA is one type of package of the integrated circuit component to be mounted mainly on the circuit board in a Surface Mount Technology (SMT) method. In the BGA, electrodes are disposed on a bottom surface of the integrated circuit component in a lattice-shaped pattern. For this reason, the BGA is able to derive more signals than that of the QFP or the like. In the BGA, BGA balls which are spherical solder members are mounted on the electrodes disposed on the package bottom portion in the lattice-shaped pattern. In general, a BGA electrode and a circuit board electrode are soldered as follows.

FIG. 5 is a diagram illustrating a soldering sequence of the BGA electrode and the circuit board electrode. First, a solder paste which is a mixture of a solder powder containing Sn as a main component and a flux is supplied onto circuit board electrode 106 disposed on substrate 105 of circuit board 104 in advance by screen printing, and thus solder paste layer 110 is formed. BGA 108 includes BGA substrate 102, BGA electrode 103 formed on BGA substrate 102, and BGA ball 101 soldered onto BGA electrode 103 in advance. Then, BGA 108 is mounted on solder paste layer 110 such that BGA ball 101 is in contact with solder paste layer 110.

Thereafter, solder paste layer 110 is heated to the melting point thereof through an arbitrary method using hot air, an infrared ray, or the like, and thus solder paste layer 110 and BGA ball 101 are melted. Then, solder paste layer 110 and BGA ball 101 are cooled and solidified, and thus solder joining portion 107 and reacted layer 109 are formed. Accordingly, BGA electrode 103 and circuit board electrode 106 are joined through solder joining portion 107 and reacted layer 109.

As a mounting structure of the related art, a mounting structure has been known in which a BGA and a circuit board are joined by using a BGA ball having a ratio of Cu in Sn—Ag—Cu-based solder or Sn—Ag—Cu—In-based solder of equal to or greater than 3 mass % (for example, refer to Japanese Patent No. 4939891).

SUMMARY

An object of the present disclosure is to provide a mounting structure and a BGA ball which have excellent thermal fatigue resistance even at the time of being exposed to a high temperature of 150° C. as in an engine room of an automobile, and are capable of ensuring electric conduction.

A mounting structure of the present disclosure includes a BGA including a BGA electrode, a circuit board including a circuit board electrode, and a solder joining portion disposed on the circuit board electrode and is connected to the BGA electrode. The solder joining portion is formed of Cu having a content ratio within a range from 0.6 mass % to 1.2 mass %, inclusive, Ag having a content ratio within a range from 3.0 mass % to 4.0 mass %, inclusive, Bi having a content ratio within a range from 0 mass % to 1.0 mass %, inclusive, In, and Sn. Then, in the solder joining portion, any one of the following conditions is satisfied according to a range of the content ratio of Cu. (1) In a case where the content ratio of Cu is within a range from 0.6 mass % to 0.91 mass %, inclusive, the content ratio of In is within a range from 5.3+(6−(1.55×Content Ratio of Cu+4.428)) mass % to 6.8+(6−(1.57×Content Ratio of Cu+4.564)) mass %, inclusive. (2) In a case where the content ratio of Cu is greater than 0.91 mass % and equal to or less than 1.0 mass %, the content ratio of In is within a range from 5.3+(6−(1.55×Content Ratio of Cu+4.428)) mass % to 6.8 mass %, inclusive. (3) In a case where the content ratio of Cu is greater than 1.0 mass % and equal to or less than 1.2 mass %, the content ratio of In is within a range from 5.3 mass % to 6.8 mass %, inclusive.

As described above, according to the mounting structure of the present disclosure, thermal fatigue resistance is excellent even at the time of being exposed to a high temperature of a maximum of 150° C. as in an engine room of an automobile, and electric conduction can be ensured.

In addition, a BGA ball of the present disclosure is a BGA ball for forming the solder joining portion of the mounting structure described above. The BGA ball is formed of Cu having a content ratio within a range from 0.6 mass % to 1.2 mass %, inclusive, Ag having a content ratio within a range from 3.0 mass % to 4.0 mass %, inclusive, Bi having a content ratio within a range from 0 mass % to 1.0 mass %, inclusive, In, and Sn. Then, in the BGA ball, any one of the following conditions is satisfied according to a range of the content ratio of Cu. (1) In a case where the content ratio of Cu is within a range from 0.6 mass % to 0.91 mass %, inclusive, the content ratio of In is within a range from 5.3+(6−(1.55×Content Ratio of Cu+4.428)) mass % to 6.8+(6−(1.57×Content Ratio of Cu+4.564)) mass %, inclusive. (2) In a case where the content ratio of Cu is greater than 0.91 mass % and equal to or less than 1.0 mass %, the content ratio of In is within a range from 5.3+(6−(1.55×Content Ratio of Cu+4.428)) mass % to 6.8 mass %, inclusive. (3) In a case where the content ratio of Cu is greater than 1.0 mass % and equal to or less than 1.2 mass %, the content ratio of In is within a range from 5.3 mass % to 6.8 mass %, inclusive.

According to the BGA ball of the present disclosure, it is possible to form a mounting structure in which electric conduction can be ensured.

DETAILED DESCRIPTION OF THE PREFERRED EMBODIMENT

Figure 1A:
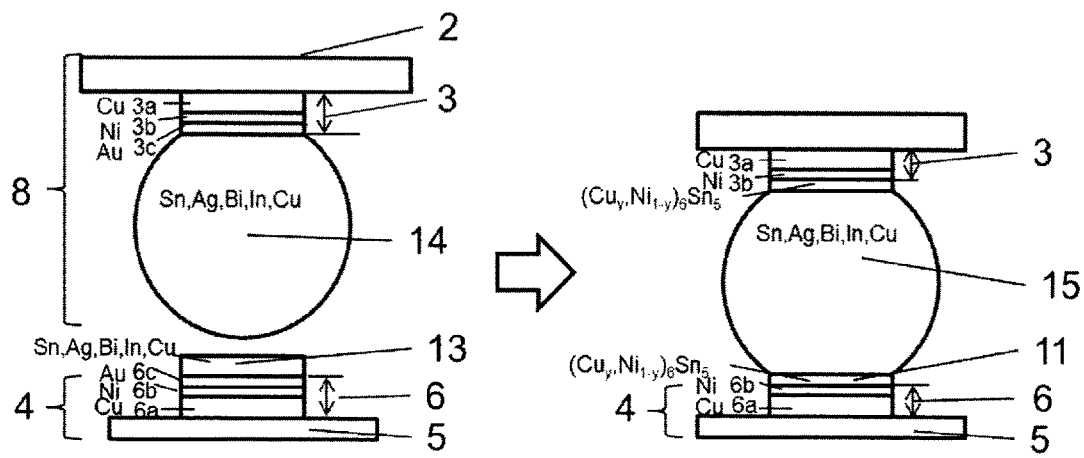
FIG. 1A is a diagram illustrating a state before and after joining a BGA and a circuit board including a circuit board electrode which is subjected to electroless Ni plating in a case that Cu is sufficiently contained in a BGA ball and a solder powder in a solder paste.

Prior to describing an exemplary embodiment of the present disclosure, problems in a mounting structure of the related art will be briefly described. The mounting structure of the related art can also be used in a high temperature environment of 150° C. as in an engine room of an automobile for a short period of time. However, in a thermal fatigue resistance evaluation of on-board (in-vehicle) standards, the result is approximately 1000 cycles, and thus the on-board standards cannot be satisfied. In the evaluation described above, a temperature cycle test is performed in test conditions of −40° C./150° C. In such a test, when disconnection does not occur in 3000 cycles or greater, it is evaluated that the thermal fatigue resistance is satisfied.

As the reason thereof, the following are considered. In solder joining portion 107 where BGA ball 101 is melted, cooled, and solidified, a proeutectic $Cu_6Sn_5$ intermetallic compound is generated. This proeutectic $Cu_6Sn_5$ has hard properties and proeutectic properties, and thus is coarsened. For this reason, the ductility of solder joining portion 107 itself is extremely small. It is considered that this proeutectic $Cu_6Sn_5$ is generated due to BGA ball 101 containing Cu in the amount of 3 mass % or greater.

An electronic device used in the engine room is repeatedly exposed to a high temperature and a low temperature according to the operation and the stopping of the automobile. For this reason, thermal stress which is generated according to a temperature change is repeatedly generated in solder joining portion 107 due to a difference in thermal expansions of circuit board 104 and BGA substrate 102.

When the ductility of solder joining portion 107 is small, a crack easily occurs in a connection interface between BGA electrode 103 and solder joining portion 107, or in a connection interface between reacted layer 109 and solder joining portion 107, and the crack grows fast. When a crack occurs in one of the connection interfaces, electric conduction is not sufficiently ensured. For this reason, it is difficult to satisfy the thermal fatigue resistance evaluation of the on-board standards.

Hereinafter, the exemplary embodiment of the present disclosure will be described with reference to the drawings.

FIG. 1A is a diagram illustrating a state before and after joining BGA ball 14 and circuit board electrode 6 which is subjected to electroless Ni plating in advance according to the exemplary embodiment of the present disclosure. The mounting structure after joining has BGA 8 including BGA electrode 3, circuit board 4 including circuit board electrode 6, and solder joining portion 15. Solder joining portion 15 is disposed on circuit board electrode 6, and is connected to BGA electrode 3.

BGA ball 14 and solder paste layer 13 include a solder powder which contains Sn as a main component, and Ag, Bi, In, and Cu. In the meanwhile, this solder powder may not contain Bi. BGA ball 14 and the solder powder in solder paste layer 13 sufficiently contains Cu (for example, 0.8 mass %).

Next, a sequence for forming a mounting structure in which BGA 8 and circuit board 4 are joined by using BGA ball 14 will be described. In a state before BGA ball 14 and circuit board electrode 6 are joined, BGA 8 includes BGA substrate 2, BGA electrode 3, and BGA ball 14. On the other hand, circuit board 4 includes substrate 5, circuit board electrode 6, and solder paste layer 13.

First, a sequence for preparing BGA 8 will be described. Sn, Ag, Bi, In, and Cu configuring a solder material of BGA ball 14 are weighed such that the total amount is 100 g. The content ratio of Ag is 3.5 mass %, that of Bi is 0.5 mass %, that of In is 5.9 mass %, that of Cu is 0.8 mass %, and that of Sn is the remaining 89.3 mass %. Hereinafter, the content ratio will be referred to as Sn-3.5 mass % of Ag-0.5 mass % of Bi-5.9 mass % of In-0.8 mass % of Cu.

The weighed Sn is put into a ceramic crucible, and is disposed in an electric jacket heater of which the temperature is adjusted to 500° C.

In (Indium) is put into the crucible after confirming that Sn has been melted, and is stirred for 3 minutes. Thereafter, Bi is put into the crucible, and is stirred for 3 minutes. Then, Ag is put into the crucible, and is stirred for 3 minutes. Finally, Cu is put into the crucible, and is stirred for 3 minutes.

Thereafter, the crucible is extracted from the electric jacket heater, and is dipped into water at 25° C. in a container thus cooled. After the cooling, the prepared solder material is processed, and thus BGA ball 14 having a diameter of 0.3 mm is prepared.

Prepared BGA ball 14 is soldered on BGA electrode 3, and thus BGA 8 is prepared. BGA electrode 3 includes Cu base 3a disposed on BGA substrate 2, electroless Ni plating film (hereinafter, referred to as Ni film) 3b formed on Cu base 3a, and Au flash plating film (hereinafter, referred to as Au film) 3c formed on Ni film 3b.

BGA ball 14 is soldered onto BGA electrode 3 by using the following method. BGA ball 14 is laid on BGA electrode 3, and a commercially available flux for soldering is dropped thereto. In this state, BGA electrode 3 is heated at a temperature from 220° C. to 250° C. for approximately 30 seconds by using a reflow furnace, and then is air-cooled to a room temperature. As described above, BGA 8 is completed.

Thereafter, BGA 8 is soldered to circuit board 4, and thus the mounting structure is formed as follows.

First, circuit board 4 including circuit board electrode 6 is prepared. A Flame Retardant (FR) Grade of substrate 5 is FR-5. Circuit board electrode 6 includes Cu base 6a, electroless Ni plating film (hereinafter, referred to as Ni film) 6b formed on Cu base 6a, and Au plating film (hereinafter, referred to as Au film) 6c formed on Ni film 6b.

Next, a solder paste which contains solder having the same composition as that of BGA ball 14 is supplied onto circuit board electrode 6 by screen printing using a metal mask. Thus, solder paste layer 13 is formed on circuit board electrode 6.

Then, BGA 8 is laid on circuit board 4 such that solder paste layer 13 overlaps with BGA ball 14. Further, solder paste layer 13 and BGA ball 14 are soldered in a reflowing process which is identical to the soldering of BGA ball 14 to BGA electrode 3.

A temperature cycle test is performed with respect to the prepared mounting structure in test conditions of −40° C./150° C. until electric conduction of solder joining portion 15 is not obtained and is broken.

As described above, in the thermal fatigue resistance evaluation of on-board merchandise mounted in vicinity of the engine of the automobile, the BGA is also required to be capable of ensuring conduction after 3000 cycles. That is, a case where the number of cycles is 3000 or greater is evaluated as satisfying the thermal fatigue resistance.

When BGA ball 14 having Sn-3.5 mass % of Ag-0.5 mass % of Bi-5.9 mass % of In-0.8 mass % of Cu described above is used, the number of cycles at which the conduction cannot be ensured is 3300, and thus it is possible to confirm that a requirement with respect to the on-board merchandise mounted in the vicinity of the engine of the automobile is satisfied.

From the above description, the mounting structure using BGA ball 14 which has the composition described above has excellent thermal fatigue resistance even at the time of being repeatedly exposed to a high temperature of a maximum of 150° C. as in an engine room of the automobile, and thus can ensure the electric conduction.

Next, the configuration of BGA ball 14 will be described in detail. First, the content ratio of Cu in BGA ball 14 will be described.

Cu is mixed in order to control a reacted layer at a joining interface between BGA ball 14 and circuit board electrode 6 or a joining interface between BGA ball 14 and BGA electrode 3 at the time of joining BGA 8.

In general, in BGA electrode 3, Ni film 3b is disposed in order to block the diffusion of elements of Cu base 3a or the like, and Au film 3c is disposed on Ni film 3b in order to suppress the oxidation of Ni.

When BGA ball 14 is soldered onto BGA substrate 2, Au film 3c is immediately melted and diffused in the solder, and disappears, and thus an alloy layer is formed on an interface between BGA electrode 3 and BGA ball 14. As a result thereof, BGA electrode 3 and BGA ball 14 are joined through this alloy layer.

Also in circuit board electrode 6, Ni film 6b partially containing P (phosphorus) therein is disposed on the surface of Cu base 6a, and Au film 6c is disposed on Ni film 6b in order to suppress the oxidation of Ni. In this case, when BGA 8 and circuit board 4 are joined, Au film 6c is immediately melted and is diffused in the solder, and thus disappears. As a result thereof, reacted layer 11 is formed on a joining interface between circuit board electrode 6 and solder joining portion 15. Solder joining portion 15 may contain Au derived from diffusing Au film 6c.

As illustrated in FIG. 1A, when Cu is sufficiently contained in BGA ball 14, in an interface where circuit board electrode 6 is in contact with the solder of BGA ball 14, Sn reacts with Cu in the solder, and thus reacted layer 11 of $Cu_6Sn_5$ is generated. At this time, a part of Ni film 6b is incorporated thereto, and thus reacted layer 11 becomes $(Cu_y,Ni_{1-y})_6Sn_5$ in which a part of Cu of $Cu_6Sn_5$ is substituted with Ni (0≤y≤1).

The content ratio of Cu will be described below in detail, and in order to form $(Cu_y,Ni_{1-y})_6Sn_5$ in which a part of Cu of $Cu_6Sn_5$ is substituted with Ni, it is considered that the content ratio of Cu has threshold values.

Figure 1B:
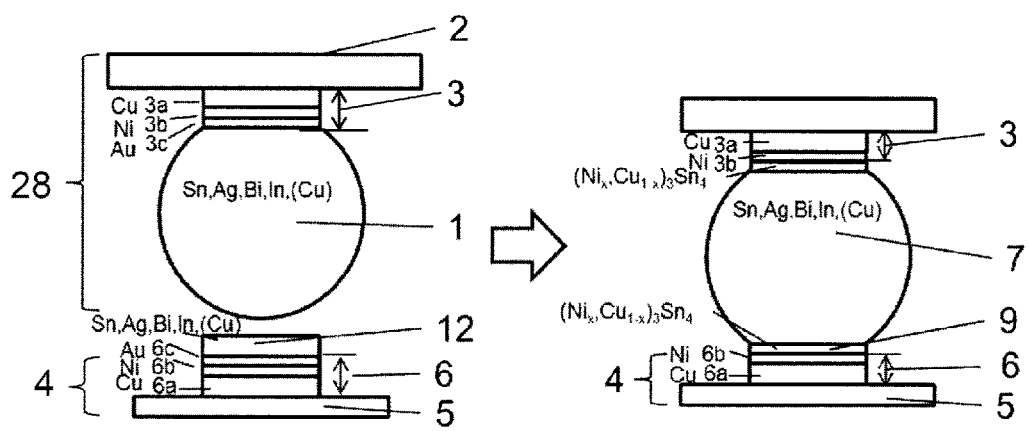
FIG. 1B is a diagram illustrating a state before and after joining a BGA and a circuit board including a circuit board electrode which is subjected to electroless Ni plating in a case that Cu is not contained in a BGA ball and a solder powder in a solder paste or is contained in a small amount.

In contrast, in FIG. 1B, Cu is not contained in BGA ball 1 and the solder powder in solder paste layer 12 or is contained in a small amount (for example, 0.3 mass %). FIG. 1B is a diagram illustrating a state before and after joining BGA 28 and circuit board 4 in such a case.

Like FIG. 1A, BGA electrode 3 includes Cu base 3a, Ni film 3b for blocking the diffusion of the elements of Cu base 3a, and Au film 3c formed on Ni film 3b and suppressing the oxidation of Ni.

When BGA ball 1 is soldered onto BGA substrate 2, Au film 3c is immediately melted and is diffused in the solder, and disappears, and thus BGA electrode 3 and BGA ball 1 are joined through the alloy layer on the interface.

When Cu is not contained in BGA ball 1 or is contained in a small amount, in an interface where circuit board electrode 6 is in contact with the solder, Sn in BGA ball 1 and solder paste layer 12 reacts with Ni in circuit board electrode 6, and thus reacted layer 9 of $Ni_3Sn_4$ is generated.

At this time, Cu configuring Cu base 6a is diffused in Ni film 6b, and thus reacted layer 9 becomes $(Ni_x,Cu_{1-x})_3Sn_4$ in which a part of Ni of $Ni_3Sn_4$ is substituted with Cu (0≤x≤1). When $(Ni_x,Cu_{1-x})_3Sn_4$ is formed as reacted layer 9, reacted layer 9 easily grows. For this reason, Ni is diffused into the solder by maintaining a high temperature in a temperature cycle, and thus $(Ni_x,Cu_{1-x})_3Sn_4$ grows.

$(Ni_x,Cu_{1-x})_3Sn_4$ is an intermetallic compound having hard and brittle properties. For this reason, thermal stress cannot be sufficiently relieved due to the growth of reacted layer 9, and thus a crack or disconnection may occur.

In addition, at the time of the growth of $(Ni_x,Cu_{1-x})_3Sn_4$, Ni is diffused into solder joining portion 7 through $(Ni_x,Cu_{1-x})_3Sn_4$. For this reason, the concentration of P in Ni film 6b becomes high in Ni film 6b in vicinity of reacted layer 9. P easily reacts with In of solder joining portion 7, and thus an InP compound is generated.

Although the details will be described below, the content ratio of In in solder joining portion 7 considerably affects the thermal fatigue resistance. Therefore, when the content ratio of In decreases, the thermal fatigue resistance is deteriorated.

From the reason described above, it is necessary to form $(Cu_y,Ni_{y-1})_6Sn_5$ as reacted layer 11 in order to ensure the electric conduction for a long period of time.

In order to form $(Cu_y,Ni_{y-1})_6Sn_5$, it is necessary that Cu is contained in solder joining portion 15 in a large amount. However, when Cu is excessively contained, a hyper-eutectic composition is obtained as in the method of the related art, and thus proeutectic $Cu_6Sn_5$ is generated in solder joining portion 15. The proeutectic $Cu_6Sn_5$ is hard. Therefore, solder joining portion 15 cannot sufficiently relieve thermal stress, and thus the occurrence and the growth of a crack, and disconnection are caused.

Therefore, it is necessary to make the content ratio of Cu in the solder configuring BGA ball 14 or solder paste layer 13 within a range where proeutectic $Cu_6Sn_5$ is not generated in solder joining portion 15, and $(Cu_y,Ni_{1-y})_6Sn_5$ is generated as reacted layer 11.

Next, a result will be described in which a relationship between the content ratio of Cu and the structures of the reacted layer and the solder material is evaluated in order to demonstrate such a range of the content ratio of Cu.

Table 1 shows the composition of the solder material used in the test, the presence or absence of the generation of proeutectic $Cu_6Sn_5$ in the solder joining portion after the soldering, the composition of the reacted layer, and a result determined in consideration of both of the presence or absence of the generation of proeutectic $Cu_6Sn_5$ and the structure of the reacted layer.

TABLE 1

| Sample | Sn | Ag | Bi | In | Cu | Generation of $Cu_6Sn_5$ | Reacted Layer | Determination |
|---|---|---|---|---|---|---|---|---|
| E1-1 | Bal. | 3.5 | 0.5 | 6.0 | 0.6 | Absent | $(Cu_{0.5}Ni_{0.5})_6Sn_5$ | OK |
| E1-2 | Bal. | 3.5 | 0.5 | 6.0 | 0.9 | Absent | $(Cu_{0.6}Ni_{0.4})_6Sn_5$ | OK |
| E1-3 | Bal. | 3.5 | 0.5 | 6.0 | 1.2 | Absent | $(Cu_{0.8}Ni_{0.2})_6Sn_5$ | OK |
| C1-4 | Bal. | 3.5 | 0.5 | 6.0 | 0.3 | Absent | $(Ni_{0.8}Cu_{0.2})_3Sn_4$ | NG |
| C1-5 | Bal. | 3.5 | 0.5 | 6.0 | 0 | Absent | $(Ni_{0.9}Cu_{0.1})_3Sn_4$ | NG |
| C1-6 | Bal. | 3.5 | 0.5 | 6.0 | 1.5 | Present | $(Cu_{0.7}Ni_{0.3})_6Sn_5$ | NG |
| C1-7 | Bal. | 3.5 | 0.5 | 6.0 | 1.8 | Present | $(Cu_{0.8}Ni_{0.2})_6Sn_5$ | NG |

First, samples evaluated in this exemplary embodiment are prepared by the following method.

Sn, Ag, Bi, In, and Cu composing the solder material of the BGA ball are weighed at the predetermined content ratio such that the total amount is 100 g. The sequence from the weighing to preparing the mounting structure is identical to the sequence described above.

In order to confirm the structures in the reacted layer and the solder of the prepared mounting structure, a sectional surface is ground, analyzed, and observed. First, the sectional surface is ground up to P2000 (ISO-P Standards 6344-3 1998) by using grinding paper. After that, the sectional surface is sequentially ground with a diamond abrasive grain of 3 μm and an $Al_2O_3$ abrasive grain of 0.05 μm, so as to be mirror finished.

The ground sectional surface of the mounting structure is analyzed by using Scanning Electron Microscope (SEM) and Energy Dispersive X-ray Spectroscopy (EDX). Then, the structures in the reacted layer and the solder are identified. In each of the samples, the presence or absence of the generation of $Cu_6Sn_5$ and the structure of the reacted layer are shown in Table 1.

As a result of confirming the presence or absence of the generation of proeutectic $Cu_6Sn_5$ in the solder, in Samples E1-1 to E1-3 and Samples C1-4 and C1-5, the generation of proeutectic $Cu_6Sn_5$ is not observed. In contrast, in Samples C1-6 and C1-7 where the content ratio of Cu is 1.5 mass % and 1.8 mass %, respectively, the generation of proeutectic $Cu_6Sn_5$ is confirmed in the solder.

Next, in Samples E1-1 to E1-3 and Samples C1-4 and C1-5 where the generation of proeutectic $Cu_6Sn_5$ is not observed, the structure of the reacted layer is confirmed. As a result thereof, it is found that, in Samples E1-1 to E1-3, $(Cu_y,Ni_{1-y})_6Sn_5$ is generated as the reacted layer, but in Samples C1-4 and C1-5 having a small content of Cu, $(Ni_x,Cu_{1-x})_3Sn_4$ is generated.

In addition, in Samples C1-6 and C1-7, $(Cu_y,Ni_{1-y})_6Sn_5$ is generated as the reacted layer, but the generation of proeutectic $Cu_6Sn_5$ is confirmed in the solder.

On the basis of such a result, in Table 1, a case where proeutectic $Cu_6Sn_5$ is not generated in the solder, and $(Cu_y,Ni_{1-y})_6Sn_5$ is generated as the reacted layer is determined as OK. In contrast, a case where proeutectic $Cu_6Sn_5$ is generated in the solder or a case where $(Ni_x,Cu_{1-x})_3Sn_4$ is generated as the reacted layer is determined as NG.

On the basis of such determination, it is apparent that the content ratio of Cu should be within a range from 0.6 mass % to 1.2 mass %, inclusive, from the composition of the solder material shown in Table 1.

Figure 2:
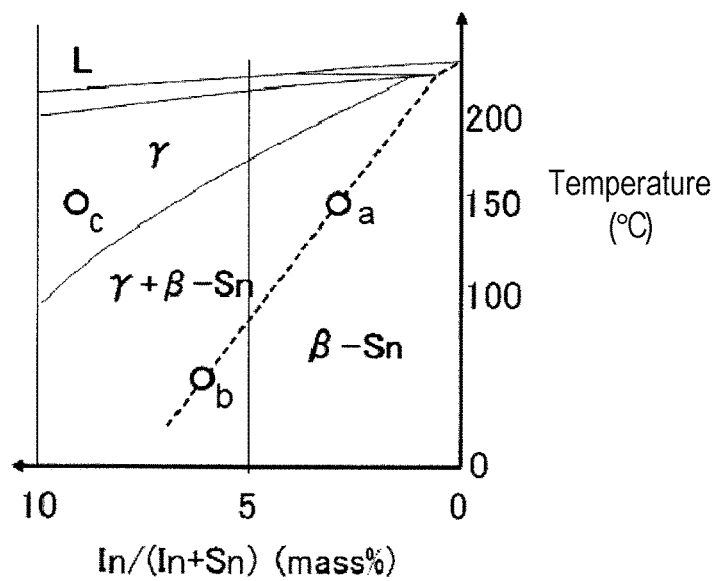
FIG. 2 is a diagram illustrating a state of a Sn—In binary alloy for describing a mounting structure according to an exemplary embodiment of the present disclosure.

Next, relation between the content ratio of In and effects relevant to the solder joining will be described. FIG. 2 is a diagram illustrating a state of a Sn—In binary alloy. Sn—In-based solder forms an alloy (β-Sn) in which In is dissolved in Sn as a solid-solution in a low In region.

The solid-solution is a phenomenon in which a part of a crystal lattice of parent metal is substituted with a solid-solution element at an atomic level. In general, the solid-solution element generates a strain in a crystal lattice of a parent element due to an atomic difference between the parent metal and the solid-solution element. For this reason, it is possible to suppress the movement of a crystal defect such as transition at the time of loading stress. As a result, it is possible to improve the strength of metal, and the ductility at the time of loading stress decreases. According to such an effect of the solid-solution, the strength of the solder increases as the content of the solid-solution element becomes higher.

BGA is larger than a passive device such as a chip resistor, and thus a thermal stress generated at the time of being exposed to a high temperature is also large. In particular, in a high temperature environment of 150° C. as in the engine room, a large thermal stress which exceeds a yield stress is generated. Therefore, a decrease in the ductility considerably affects the thermal fatigue resistance.

When In is dissolved in Sn-based solder as a solid-solution, the same effect is developed around a room temperature, and when the temperature becomes high, a γ phase having a different structure appears due to phase transformation. That is, a state where two different phases coexist (γ+β-Sn) is obtained. According to such a state where the two phases coexist, the ductility at a high temperature is improved.

The phase transformation to the γ phase has different developing behavior according to the content ratio of In and the temperature. As illustrated in FIG. 2, a temperature at which a state where two phases of β-Sn and γ coexist starts to be generated, for example, is lower as the content ratio of In increases as in a relationship between point a and point b. For this reason, when the content ratio of In is low, the temperature becomes higher than the temperature at which the ductility is improved, and thermal stress generated while the temperature rises is not sufficiently relieved, and thus a crack or disconnection occurs.

In contrast, when the content ratio of In is excessively high, the phase transformation starts at a lower temperature. For this reason, for example, in a step of the highest temperature of 150° C. as in point c, the majority of the structures become γ phase. The phase transformation from β-Sn to γ phase accompanies a volume change, and thus when the content ratio of In is excessively high, the solder self-collapses, and it is difficult to ensure the electric conduction for a long period of time.

For this reason, the content ratio of In in the BGA ball should be in a range where heat resistance of a maximum of 150° C. can be ensured and self-collapse does not occur.

Figure 3:
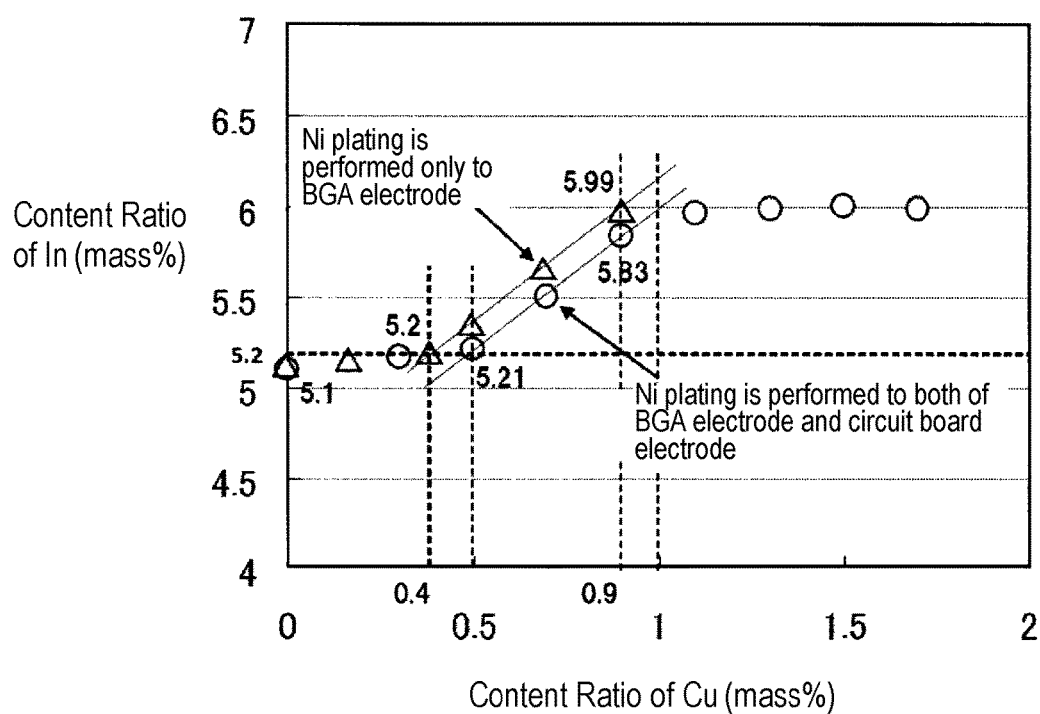
FIG. 3 is a diagram illustrating an analysis result of the content ratio of In in a solder joining portion after performing soldering on the circuit board electrode including electroless Ni plating by using an alloy containing Cu which has a composition of Sn-3.5 mass % of Ag-0.5 mass % of Bi-6.0 mass % of In in order to describe the mounting structure according to the exemplary embodiment of the present disclosure.

As described above, In reacts with P in the reacted layer between the solder joining portion and the electroless Ni plating of the electrode, and thus the content ratio of In in the solder joining portion before and after the joining is changed. The change in the content ratio of In will be described with reference to FIG. 3. FIG. 3 illustrates an analysis result of the content ratio of In in the solder joining portion after soldering onto the circuit board electrode including electroless Ni plating by using an alloy containing Cu which has a composition of Sn-3.5 mass % of Ag-0.5 mass % of Bi-6.0 mass % of In.

Here, as with the method described above, the content ratio of In after soldering onto the circuit board electrode including the electroless Ni plating is measured by using the EDX.

Samples are prepared as follows. The solder material is prepared by the same method as that described above.

The prepared solder material is processed into a BGA ball having a diameter of 0.3 mm. On the other hand, a land grid array (LGA) having 132 pins, a size of 8 mm×8 mm, and a ball pitch of 0.5 mm is prepared. This LGA has an LGA electrode having a diameter of 0.25 mm, and the LGA electrode is subjected to Ni plating having a thickness of 5 μm and then Au flash plating. After a commercially available flux for soldering is dropped in advance on the LGA electrode, the BGA ball is laid thereon. Thereafter, the BGA ball is joined to the LGA electrode in the reflow conditions of the same method as that described above, and thus a BGA is prepared.

Then, a solder paste including a solder powder having the same composition as the BGA ball is printed on the circuit board electrode to have a thickness of 120 μm, and then the BGA is laid on the circuit board such that the position of the BGA ball of the BGA corresponds to the position of the circuit board electrode. After that, the BGA ball is joined to the circuit board electrode on the circuit board in the reflow conditions of the same method as that described above.

Here, two types of electrodes are used as the circuit board electrode. In one type of the electrodes, Cu is subjected to electroless Ni plating having a thickness of 5 μm and then Au flash plating thereon. In another type of the electrodes, Cu is treated with preflux.

In the case of performing the electroless Ni plating only to the BGA electrode, when the content ratio of Cu is zero, the content ratio of In in the solder joining portion is 5.1 mass %; however, when the content ratio of Cu increases, a decrease in In is suppressed, and thus the content ratio of In increases. When the content ratio of Cu is 0.4 mass %, the content ratio of In is 5.2 mass %. Further, when the content ratio of Cu is 0.9 mass %, the content ratio of In is 5.99 mass %.

In the case of performing the electroless Ni plating to both of the BGA electrode and the circuit board electrode, when the content ratio of Cu is zero, the content ratio of In in the solder joining portion is 5.1 mass %; however, when the content ratio of Cu increases, a decrease in In is suppressed, and thus the content ratio of In increases. Then, when the content ratio of Cu is 0.5 mass %, the content ratio of In is 5.21 mass %. Further, when the content ratio of Cu is 0.9 mass %, the content ratio of In is 5.83 mass %.

When both cases are compared, the case where both of the BGA electrode and the circuit board electrode are subjected to the electroless Ni plating has a large amount of change in the content ratio of In. For this reason, it is preferable that the lower limit value of the content ratio of Cu is calculated by a value in the case of performing the electroless Ni plating to the both surfaces. On the other hand, it is preferable that the upper limit value is calculated by a value in the case of performing the electroless Ni plating only to the BGA electrode.

In a case where the electroless Ni plating is performed to both of the BGA electrode and the circuit board electrode, when an approximate straight line illustrating a relationship between the content ratio of Cu and the content ratio of In is drawn by using values at the time that the content ratio of Cu is in a range from 0.5 mass % to 0.9 mass %, inclusive, the following graph of a linear function is obtained.

$$\text{(Content Ratio of In)}=1.55\times\text{(Content Ratio of Cu)}+4.428 \quad (1)$$

On the other hand, in a case where the electroless Ni plating is performed only to the BGA electrode, when an approximate straight line is drawn, the following graph of a linear function is obtained.

$$\text{(Content Ratio of In)}=1.57\times\text{(Content Ratio of Cu)}+4.564 \quad (2)$$

FIG. 3 illustrates these approximate straight lines.

As described above, when the content ratio of Cu is in a range from 0.6 mass % to 1.2 mass %, inclusive, proeutectic $Cu_6Sn_5$ is not generated in the solder joining portion, and $(Cu_y,Ni_{1-y})_6Sn_5$ is generated as the reacted layer. In this range, when the content ratio of Cu is in a range from 0.6 mass % to 1.0 mass %, inclusive, it is necessary to have a composition in consideration of a decrease in the content ratio of In according to Expression (1) and Expression (2).

Next, the content ratio of In satisfying the thermal fatigue resistance of the on-board standards will be described with reference to a case where the content ratio of Cu is greater than 1.0 mass % where a decrease in the content ratio of In does not occur.

Figure 4:
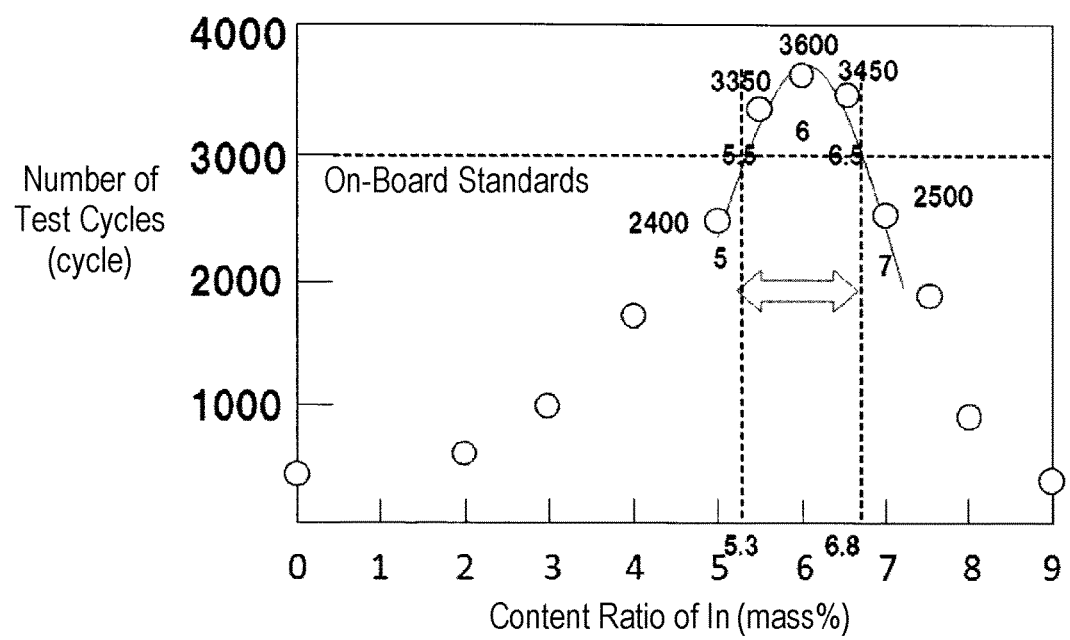
FIG. 4 is a diagram illustrating a thermal fatigue resistance evaluation result of the solder joining portion containing In which has a composition of Sn-3.5 mass % of Ag-0.5 mass % of Bi-1.2 mass % of Cu in order to describe the mounting structure according to the exemplary embodiment of the present disclosure.
Figure 5:
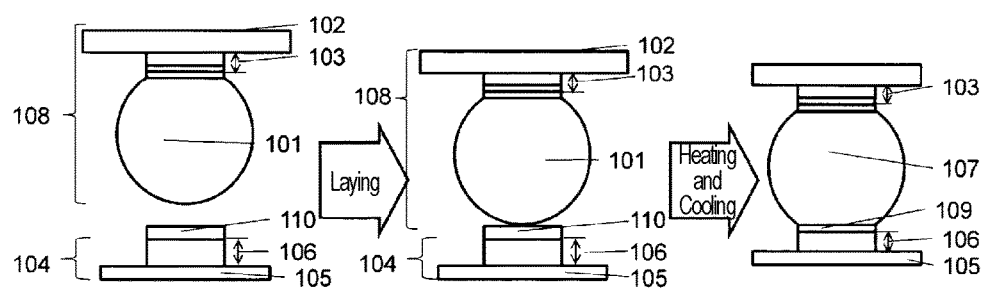
FIG. 5 is an explanatory diagram illustrating a soldering sequence of a BGA electrode and a circuit board electrode of the related art.

FIG. 4 is a diagram illustrating an evaluation result of the thermal fatigue resistance of the solder joining portion containing In and having a composition of Sn-3.5 mass % of Ag-0.5 mass % of Bi-1.2 mass % of Cu for describing the mounting structure according to this exemplary embodiment.

In this evaluation, a candidate is a mounting structure in which the BGA described above is mounted on the circuit board including a circuit board electrode subjected to the electroless Ni plating and a substrate having FR-5 grade. The number of test cycles on a vertical axis indicates the number of cycles at which the electric conduction of the solder joining portion is not obtained but is broken when a temperature cycle test is performed with respect to such a mounting structure in test conditions of −40° C./150° C. A horizontal axis indicates the content ratio of In in the solder joining portion.

In the evaluation of the thermal fatigue resistance of the on-board merchandise mounted in vicinity of the engine of the automobile, it is required that the BGA can ensure the conduction in 3000 cycles or greater.

The number of cycles is 3000 or greater when the content ratio of In which is dissolved in the solder joining portion as a solid-solution after the soldering is 5.5 mass % (3350 cycles), 6.0 mass % (3600 cycles), and 6.5 mass % (3450 cycles). On the other hand, when the content ratio of In is equal to or less than 5.0 mass % or equal to or greater than 7.0 mass %, the number of cycles is less than 3000.

In respective cases where the content ratios of In are 5.0 mass % and 7.0 mass %, the sectional surface of the solder joining portion is observed after completing the evaluation of the thermal fatigue resistance. In a case where the content ratio of In is 5.0 mass %, a breakage which is assumed to be generated due to the growth of a crack during thermal fatigue is observed. On the other hand, in a case where the content ratio of In is 7.0 mass %, the self-collapse of the solder structure as described above is observed.

Meanwhile, FIG. 4 illustrates an approximate curve which is obtained by using the data described above. This approximate curve indicates the following quadratic function.

(Number of Test Cycles)=−1200×(Content Ratio of In)$^2$+14460×(Content Ratio of In)−39900     (3)

Therefore, the content ratio of In capable of ensuring the number of cycles of 3000 or greater, which is one of the on-board standards, is approximately in a range from 5.3 mass % to 6.8 mass %, inclusive, thus, a management range is approximately ±0.75 mass %.

In mass production, as a variation range of the content ratio of In in the solder alloy is approximately ±0.5 mass %, it is preferable that the median of the content ratio of In is in a range from 5.8 (=5.3+0.5) mass % to 6.3 (=6.8−0.5) mass %, inclusive.

In the above description, the BGA ball having a content ratio of Cu of 1.2 mass % is used. When the content ratio of Cu is in a range from 0.6 mass % to 1.0 mass %, inclusive, the content ratio of In is changed before and after the joining as described above.

When the electroless Ni plating is performed to both of the BGA electrode and the circuit board electrode, the amount of change in the content ratio of In is 0.6 mass % in a case where the content ratio of Cu is 0.6 mass %. Therefore, when the electroless Ni plating is performed to the BGA electrode and the circuit board electrode, for example, in a case where a BGA ball and a solder paste having a composition of Sn-3.5 mass % of Ag-0.5 mass % of Bi-0.6 mass % of Cu-5.5 mass % of In are used, the content ratio of In in the solder joining portion after the soldering is 4.9 mass %. Thus, reliability of the on-board standards cannot be satisfied.

When the content ratio of Cu is in a range from 0.6 mass % to 1.0 mass %, inclusive, there is a correlation illustrated in the approximate straight line of FIG. 3 between the content ratio of Cu and the content ratio of In. Therefore, the lower limit value of the content ratio of In is as follows.

In a range of 0.6 mass %≤Content Ratio of Cu≤1.0 mass %, the lower limit value of the content ratio of In is 5.3+(6−(1.55×Content Ratio of Cu+4.428)) mass %.

In a range of 1.0 mass %<Content Ratio of Cu≤1.2 mass %, the lower limit value of the content ratio of In is 5.3 mass %.

On the other hand, the upper limit value of the content ratio of In is as follows.

In a range of 0.6 mass %≤Content Ratio of Cu≤0.91 mass %, the upper limit value of the content ratio of In is 6.8+(6−(1.57×Content Ratio of Cu+4.564)) mass %.

In a range of 0.91 mass %<Content Ratio of Cu≤1.2 mass %, the upper limit value of the content ratio of In is 6.8 mass %.

Table 2 shows the composition of the solder material, the presence or absence of the generation of $Cu_6Sn_5$, and the structure of the reacted layer in mounting structures of Samples E2-1 to E2-9 and Samples C2-1 to C2-8 in which the BGA electrode and the circuit board electrode are subjected to the electroless Ni plating. The composition of the solder material indicates the composition of the BGA ball and the solder powder contained in the solder paste before the soldering. In addition, Table 3 shows a change in the content ratio of In in the solder joining portion after the soldering, the result of the temperature cycle test, and a reliability determination result based thereon of the same samples.

In Table 2, the generation of $Cu_6Sn_5$ is not preferable. Regarding the structure of the reacted layer, sectional surface observation and EDX analysis are performed with respect to the solder joining portion after the soldering, and OK indicates a case where $(Cu_y,Ni_{1-y})_6Sn_5$ is generated.

TABLE 2

| Sample | Sn | Ag | Bi | Cu | In | Generation of $Cu_6Sn_5$ | Reacted Layer | Determination |
|---|---|---|---|---|---|---|---|---|
| E2-1 | Bal. | 3.5 | 0.5 | 0.8 | 5.9 | Absent | $(Cu_y,Ni_{1-y})_6Sn_5$ | OK |
| E2-2 | Bal. | 2.2 | 0.7 | 1.2 | 6.8 | Absent | $(Cu_y,Ni_{1-y})_6Sn_5$ | OK |
| E2-3 | Bal. | 3.8 | 0.6 | 1.1 | 6.0 | Absent | $(Cu_y,Ni_{1-y})_6Sn_5$ | OK |
| E2-4 | Bal. | 3.0 | 6.5 | 0.95 | 6.5 | Absent | $(Cu_y,Ni_{1-y})_6Sn_5$ | OK |
| E2-5 | Bal. | 0.7 | 0.9 | 0.6 | 6.6 | Absent | $(Cu_y,Ni_{1-y})_6Sn_5$ | OK |
| E2-6 | Bal. | 1.8 | 0.7 | 0.8 | 6.7 | Absent | $(Cu_y,Ni_{1-y})_6Sn_5$ | OK |
| E2-7 | Bal. | 1.0 | 1.0 | 1.0 | 5.3 | Absent | $(Cu_y,Ni_{1-y})_6Sn_5$ | OK |
| E2-8 | Bal. | 3.5 | 1.0 | 1.2 | 6.1 | Absent | $(Cu_y,Ni_{1-y})_6Sn_5$ | OK |
| E2-9 | Bal. | 3.0 | 0.8 | 1.2 | 5.4 | Absent | $(Cu_y,Ni_{1-y})_6Sn_5$ | OK |
| C2-1 | Bal. | 2.8 | 0.4 | 1.4 | 6.8 | Present | $(Cu_y,Ni_{1-y})_6Sn_5$ | OK |
| C2-2 | Bal. | 3.5 | 0.5 | 0.2 | 5.7 | Absent | $(Ni_y,Cu_{1-y})_3Sn_4$ | NG |
| C2-3 | Bal. | 2.8 | 0.3 | 1.2 | 7.0 | Absent | $(Cu_y,Ni_{1-y})_6Sn_5$ | OK |
| C2-4 | Bal. | 3.0 | 0.8 | 0.4 | 5.8 | Absent | $(Ni_y,Cu_{1-y})_3Sn_4$ | NG |
| C2-5 | Bal. | 0.7 | 0.8 | 0.4 | 6.3 | Absent | $(Ni_y,Cu_{1-y})_3Sn_4$ | NG |
| C2-6 | Bal. | 3.5 | 0.5 | 0 | 5.9 | Absent | $(Ni_y,Cu_{1-y})_3Sn_4$ | NG |
| C2-7 | Bal. | 3.0 | 0 | 3.0 | 0.5 | Present | $(Cu_y,Ni_{1-y})_6Sn_5$ | OK |
| C2-8 | Bal. | 1.0 | 0 | 3.0 | 0 | Present | $(Cu_y,Ni_{1-y})_6Sn_5$ | OK |

TABLE 3

| | Change in Content of In after Soldering | | Result of Temperature Cycle Test | |
|---|---|---|---|---|
| Sample | In | Determination | Amount of Change in In | Number of Cycles | Determination |
| E2-1 | 5.6 | OK | −0.3 | 3500 | EX |
| E2-2 | 6.8 | OK | 0 | 3000 | OK |
| E2-3 | 6.0 | OK | 0 | 3600 | EX |
| E2-4 | 6.3 | OK | −0.2 | 3550 | EX |

TABLE 3-continued

| | Change in Content of In after Soldering | | | Result of Temperature Cycle Test | |
|---|---|---|---|---|---|
| Sample | In | Determination | Amount of Change in In | Number of Cycles | Determination |
| E2-5 | 5.9 | OK | −0.7 | 3600 | EX |
| E2-6 | 6.4 | OK | −0.3 | 3350 | OK |
| E2-7 | 5.3 | OK | 0 | 3000 | OK |
| E2-8 | 6.1 | OK | 0 | 3650 | EX |
| E2-9 | 5.4 | OK | 0 | 3200 | OK |
| C2-1 | 6.8 | OK | 0 | 2400 | NG |
| C2-2 | 4.9 | NG | −0.8 | 1950 | NG |
| C2-3 | 7.0 | NG | 0 | 1800 | NG |
| C2-4 | 5.0 | NG | −0.8 | 1150 | NG |
| C2-5 | 5.5 | OK | −0.8 | 1650 | NG |
| C2-6 | 5.1 | NG | −0.8 | 1200 | NG |
| C2-7 | 0.5 | NG | 0 | 1000 | NG |
| C2-8 | 0 | NG | 0 | 850 | NG |

In Table 3, a change in the content ratio of In is measured by analyzing the content ratio of In in the solder joining portion after performing the soldering to the circuit board electrode using the EDX.

In the determination of the change in the content ratio of In, OK indicates that the content ratio of In in the solder joining portion is in a range of 5.3 mass % to 6.8 mass %, inclusive. NG indicates that the content ratio of In is less than 5.3 mass % or greater than 6.8 mass %. This determination is based on the matter that the range of the content ratio of In capable of ensuring the number of cycles of 3000 or greater, which is one of the on-board standards described above, is set to approximately 5.3 mass % to 6.8 mass %.

The reliability determination is based on whether or not the number of cycles in the temperature cycle test satisfies the requirement of 3000 cycles or greater, or 3500 cycles or greater in the evaluation of the thermal fatigue resistance of the on-board merchandise. OK indicates that a crack causing the breakage of the solder joining portion does not occur in 3000 cycles and reliability standards are satisfied. EX indicates that a crack causing the breakage of the solder joining portion does not occur in 3500 or greater cycles and the reliability standards are satisfied. NG indicates that a crack causing the breakage of the solder joining portion occurs, and the reliability standards are not satisfied.

From the reliability determination of Samples E2-1 to E2-9, it is found that in the solder joining portion where Cu is contained in the composition of Sn—Ag—Bi—In, proeutectic $Cu_6Sn_5$ is not generated, the reacted layer becomes $(Cu_y,Ni_{1-y})_6Sn_5$, and a decrease in the content ratio of In is suppressed.

In Sample C2-1, and Samples C2-7 and C2-8 which are the mounting structures of the related art containing Cu in the amount of 3 mass % or greater, Cu is excessively contained. Therefore, proeutectic $Cu_6Sn_5$ is generated in the solder joining portion, and thus these samples are not preferable.

In Samples C2-2, and C2-4 to C2-6, Cu is not sufficiently contained, and thus the reacted layer after the soldering becomes $(Ni_x,Cu_{1-x})_3Sn_4$. As a result, the determination of each of them is NG.

In addition, in Samples C2-2, C2-4, and C2-6, a Cu element which is effective for suppressing a decrease in the content ratio of In is not sufficiently contained. Accordingly, the content ratio of In in the solder joining portion is in a range from 4.9 mass % to 5.1 mass %, and the change in the content ratio of In is −0.8 mass %. In addition, in Sample C2-3, the content ratio of Cu is large with respect to the content ratio of In, and thus the content ratio of In is 7.0 mass %. In these samples, the determination is NG.

In the evaluation of the −40° C./150° C. thermal fatigue resistance of Samples E2-1 to E2-9, the conduction is ensured in 3000 cycles or greater, which is one of the on-board standards, and thus the determination is OK or higher. In particular, in Samples E2-1, E2-3 to E2-5, and E2-8, the conduction is ensured even after 3500 cycles, and thus the determination is EX.

In contrast, in all of Samples C2-1 to C2-6, and Samples C2-7 and C2-8 which are examples of the related art, a breakage occurs before 3000 cycles of the on-board standards due to the generation of proeutectic $Cu_6Sn_5$ and the growth of the reacted layer, or the self-collapse of the solder joining portion. Therefore, the determination of each of these samples is NG.

Table 4 shows the composition of the solder material, the presence or absence of the generation of $Cu_6Sn_5$, and the structure of the reacted layer in mounting structures of Samples E3-1 to E3-9 and Samples C3-1 to C3-7 in which the circuit board electrode is an electrode subjected to Cu preflux. In addition, Table 5 shows a change in the content ratio of In in the solder joining portion after the soldering, the result of the temperature cycle test, and a reliability determination result based thereon in the same samples. The determinations are identical to those in Table 2 and Table 3 described above.

TABLE 4

| Sample | Sn | Ag | Bi | Cu | In | Generation of $Cu_6Sn_5$ | Reacted Layer | Determination |
|---|---|---|---|---|---|---|---|---|
| E3-1 | Bal. | 3.5 | 0.5 | 0.8 | 5.9 | Absent | $(Cu_y,Ni_{1-y})_6Sn_5$ | OK |
| E3-2 | Bal. | 2.2 | 0.7 | 1.2 | 6.8 | Absent | $(Cu_y,Ni_{1-y})_6Sn_5$ | OK |
| E3-3 | Bal. | 3.8 | 0.6 | 1.1 | 6.0 | Absent | $(Cu_y,Ni_{1-y})_6Sn_5$ | OK |
| E3-4 | Bal. | 3.0 | 6.5 | 0.95 | 6.5 | Absent | $(Cu_y,Ni_{1-y})_6Sn_5$ | OK |
| E3-5 | Bal. | 0.7 | 0.9 | 0.6 | 6.6 | Absent | $(Cu_y,Ni_{1-y})_6Sn_5$ | OK |
| E3-6 | Bal. | 1.8 | 0.7 | 0.8 | 6.7 | Absent | $(Cu_y,Ni_{1-y})_6Sn_5$ | OK |
| E3-7 | Bal. | 1.0 | 1.0 | 1.0 | 5.3 | Absent | $(Cu_y,Ni_{1-y})_6Sn_5$ | OK |
| E3-8 | Bal. | 3.5 | 1.0 | 1.2 | 6.1 | Absent | $(Cu_y,Ni_{1-y})_6Sn_5$ | OK |
| E3-9 | Bal. | 3.0 | 0.8 | 1.2 | 5.4 | Absent | $(Cu_y,Ni_{1-y})_6Sn_5$ | OK |
| C3-1 | Bal. | 3.5 | 0.5 | 0.2 | 5.7 | Absent | $(Ni_y,Cu_{1-y})_3Sn_4$ | NG |
| C3-2 | Bal. | 2.8 | 0.3 | 1.2 | 7.0 | Absent | $(Cu_y,Ni_{1-y})_6Sn_5$ | OK |
| C3-3 | Bal. | 3.0 | 0.8 | 0.4 | 5.8 | Absent | $(Ni_y,Cu_{1-y})_3Sn_4$ | NG |
| C3-4 | Bal. | 0.7 | 0.8 | 0.4 | 6.3 | Absent | $(Ni_y,Cu_{1-y})_3Sn_4$ | NG |
| C3-5 | Bal. | 3.5 | 0.5 | 0 | 5.9 | Absent | $(Ni_y,Cu_{1-y})_3Sn_4$ | NG |
| C3-6 | Bal. | 3.0 | 0 | 3.0 | 0.5 | Present | $(Cu_y,Ni_{1-y})_6Sn_5$ | OK |
| C3-7 | Bal. | 1.0 | 0 | 3.0 | 0 | Present | $(Cu_y,Ni_{1-y})_6Sn_5$ | OK |

TABLE 5

| | Change in Content of In after Soldering | | | Result of Temperature Cycle Test | |
|---|---|---|---|---|---|
| Sample | In | Determination | Amount of Change in In | Number of Cycles | Determination |
| E3-1 | 5.7 | OK | −0.2 | 3500 | EX |
| E3-2 | 6.8 | OK | 0 | 3000 | OK |
| E3-3 | 6.0 | OK | 0 | 3600 | EX |
| E3-4 | 6.5 | OK | 0 | 3400 | OK |
| E3-5 | 6.2 | OK | −0.4 | 3600 | EX |
| E3-6 | 6.5 | OK | −0.2 | 3400 | OK |
| E3-7 | 5.3 | OK | 0 | 3000 | OK |
| E3-8 | 6.1 | OK | 0 | 3650 | EX |
| E3-9 | 5.4 | OK | 0 | 3200 | OK |
| C3-1 | 4.9 | NG | −0.8 | 1950 | NG |
| C3-2 | 7.0 | NG | 0 | 1800 | NG |
| C3-3 | 5.0 | NG | −0.8 | 1150 | NG |
| C3-4 | 5.5 | OK | −0.8 | 1650 | NG |
| C3-5 | 5.1 | NG | −0.8 | 1200 | NG |
| C3-6 | 0.5 | NG | 0 | 1000 | NG |
| C3-7 | 0 | NG | 0 | 900 | NG |

In Samples E3-1 to E3-9, all of the evaluation items satisfy the standards, and are determined as OK or EX.

Samples C3-6 and C3-7 are the mounting structures of the related art in which Cu is contained in the amount of 3 mass % or greater. In these samples, proeutectic $Cu_6Sn_5$ is generated in the solder joining portion, and thus these samples are not preferable. Further, the number of cycles is 1100 and 900, and does not satisfy 3000 cycles or greater of the on-board standards, and thus the determination after the soldering is NG.

In Samples C3-1, and C3-3 to C3-5, Cu is not sufficiently contained, and thus the reacted layer after the soldering becomes $(Ni_x,Cu_{1-x})_3Sn_4$. Therefore, the determination of the structure of the reacted layer is NG. Further, the number of cycles does not satisfy 3000 cycles or greater of the on-board standards, and thus the determination after the soldering is NG.

In addition, in Samples C3-1, C3-3, and C3-5, and Samples C3-6 and C3-7 which are the mounting structures of the related art, the Cu element effective for suppressing a decrease in the content ratio of In is not sufficiently contained. Accordingly, the content ratio of In in the solder joining portion is in a range from 4.9 mass % to 5.1 mass %, and the change in the content ratio of In is −0.8 mass %. In addition, in Sample C3-2, the content ratio of Cu is large with respect to the content ratio of In, and the content ratio of In is 7.0 mass %. Therefore, in these samples, the determination of the change in the content of In is NG.

Table 6 and Table 7 show the results of the same evaluations as those in Table 2 and Table 3 in mounting structures of Samples E4-1 to E4-10 using a BGA ball and a solder paste in which Bi is not contained.

TABLE 6

| Sample | Sn | Ag | Bi | Cu | In | Generation of $Cu_6Sn_5$ | Reacted Layer | Determination |
|---|---|---|---|---|---|---|---|---|
| E4-1 | Bal. | 0.7 | 0 | 0.75 | 5.9 | Absent | $(Cu_y,Ni_{1-y})_6Sn_5$ | OK |
| E4-2 | Bal. | 4.0 | 0 | 1.0 | 5.6 | Absent | $(Cu_y,Ni_{1-y})_6Sn_5$ | OK |
| E4-3 | Bal. | 2.9 | 0 | 0.9 | 6.0 | Absent | $(Cu_y,Ni_{1-y})_6Sn_5$ | OK |
| E4-4 | Bal. | 3.5 | 0 | 1.2 | 5.6 | Absent | $(Cu_y,Ni_{1-y})_6Sn_5$ | OK |
| E4-5 | Bal. | 0.5 | 0 | 0.6 | 6.8 | Absent | $(Cu_y,Ni_{1-y})_6Sn_5$ | OK |
| E4-6 | Bal. | 1.2 | 0 | 1.2 | 5.8 | Absent | $(Cu_y,Ni_{1-y})_6Sn_5$ | OK |
| E4-7 | Bal. | 3.2 | 0 | 1.1 | 6.2 | Absent | $(Cu_y,Ni_{1-y})_6Sn_5$ | OK |
| E4-8 | Bal. | 2.1 | 0 | 0.95 | 6.5 | Absent | $(Cu_y,Ni_{1-y})_6Sn_5$ | OK |
| E4-9 | Bal. | 1.9 | 0 | 0.7 | 6.6 | Absent | $(Cu_y,Ni_{1-y})_6Sn_5$ | OK |
| E4-10 | Bal. | 2.8 | 0 | 0.85 | 6.1 | Absent | $(Cu_y,Ni_{1-y})_6Sn_5$ | OK |

TABLE 7

| | Change in Content of In after Soldering | | | Result of Temperature Cycle Test | |
|---|---|---|---|---|---|
| Sample | In | Determination | Amount of Change in In | Number of Cycles | Determination |
| E4-1 | 5.5 | OK | −0.4 | 3300 | OK |
| E4-2 | 5.5 | OK | −0.1 | 3300 | OK |
| E4-3 | 5.8 | OK | −0.2 | 3600 | EX |
| E4-4 | 5.6 | OK | 0 | 3400 | OK |
| E4-5 | 6.2 | OK | −0.6 | 3600 | EX |
| E4-6 | 5.8 | OK | 0 | 3500 | EX |
| E4-7 | 6.2 | OK | 0 | 3600 | EX |
| E4-8 | 6.4 | OK | −0.1 | 3350 | OK |
| E4-9 | 6.1 | OK | −0.5 | 3650 | EX |
| E4-10 | 5.9 | OK | −0.2 | 3650 | EX |

In Samples E4-1 to E4-10, all the results of the reliability determination satisfy the standards, and thus it is found that the change in the content ratio of In is not affected even when Bi is not contained in the BGA ball. Bi is added to the BGA ball in order to adjust the melting temperature of the alloy, and the content of Bi does not affect the thermal fatigue resistance.

From the results of the reliability determination shown in Samples E2-1 to E4-10 of Table 2 to Table 7, in order to satisfy the evaluation of the thermal fatigue resistance of the on-board merchandise in the soldering of the BGA, the solder joining portion is formed of Cu having a content ratio in a range from 0.6 mass % to 1.2 mass %, inclusive, Ag having a content ratio in a range from 3.0 mass % to 4.0 mass %, inclusive, Bi having a content ratio in a range from 0 mass % to 1.0 mass %, inclusive, In, and Sn. Then, (1) in a case that the content ratio of Cu is in a range from 0.6 mass % to 0.91 mass %, inclusive, the content ratio of In is in a range from 5.3+(6−(1.55×Content Ratio of Cu+4.428)) mass % to 6.8+(6−(1.57×Content Ratio of Cu+4.564)) mass %, inclusive, (2) in a case that the content ratio of Cu is greater than 0.91 mass % and equal to or less than 1.0 mass %, the content ratio of In is in a range from 5.3+(6−(1.55×Content Ratio of Cu+4.428)) mass % to 6.8 mass %, inclusive, (3) in a case that the content ratio of Cu is greater than 1.0 mass % and equal to or less than 1.2 mass %, the content ratio of In is in a range from 5.3 mass % to 6.8 mass %, inclusive.

The mounting structure satisfying any one of (1) to (3) described above can comply with the standards of the reliability determination of the BGA after the soldering.

More preferably, the solder joining portion is formed of Cu having a content ratio in a range from 0.6 mass % to 1.2 mass %, inclusive, Ag having a content ratio in a range from 3.0 mass % to 4.0 mass %, inclusive, Bi having a content ratio in a range from 0 mass % to 1.0 mass %, inclusive, In, and Sn. Then, (1) in a case that the content ratio of Cu is in a range from 0.6 mass % to 0.91 mass %, inclusive, the content ratio of In is in a range from 5.5+(6−(1.55×Content Ratio of Cu+4.428)) mass % to 6.3+(6−(1.57×Content Ratio of Cu+4.564)) mass %, inclusive, (2) in a case that the content ratio of Cu is greater than 0.91 mass % and equal to or less than 1.0 mass %, the content ratio of In is in a range from 5.5+(6−(1.55×Content Ratio of Cu+4.428)) mass % to 6.3 mass %, inclusive, (3) in a case that the content ratio of Cu is greater than 1.0 mass % and equal to or less than 1.2 mass %, the content ratio of In is in a range from 5.5 mass % to 6.3 mass %, inclusive.

The mounting structure satisfying any one of (1) to (3) described above can maintain higher reliability of the BGA after the soldering.

Meanwhile, the content ratio of Ag configuring the BGA ball in the exemplary embodiment is determined by the following reason. As described above, thermal fatigue resistance is improved by a solid-solution function of In with respect to Sn. Accordingly, the thermal fatigue resistance is considerably changed according to the amount of In. However, as Ag is not dissolved in Sn as a solid-solution, the thermal fatigue resistance is not considerably changed.

In addition, as the amount of Ag affects the melting point, when the content ratio of Ag exceeds 4 mass %, the melting point is 235° C. or higher, and the solder does not easily wet-spreads at the time of the soldering. Accordingly, the maximum value of the content ratio of Ag is set to 4 mass %. In contrast, when the content ratio of Ag decreases, the amount of precipitation of $Ag_3Sn$ in a Sn phase decreases, and mechanical strength properties decrease. Accordingly, the minimum value of the content ratio of Ag is set to 0.3 mass %.

In addition, the content ratio of Bi configuring the BGA ball in this exemplary embodiment is determined by the following reason. As described in the commentary of Table 6 and Table 7, the minimum value of the content ratio of Bi can be zero since Bi does not affect the thermal fatigue resistance. In addition, Bi has properties of being segregated in the solder joining portion. Therefore, if the content ratio of Bi exceeds 1 mass %, the amount of segregation increases, and the BGA ball becomes brittle. Accordingly, the maximum value of the content ratio of Bi is set to 1 mass %.

Furthermore, Ag and Bi do not affect the thermal fatigue resistance of the BGA ball, and thus it is considered that the same effect of the content ratio of In in Sn—Ag—Bi—In can be applied to Sn—Ag—In or Sn—Bi—In.

Further, a case where the Au flash plating is performed on the electroless Ni plating is described as the plating configuration of the BGA electrode and the circuit board electrode in this exemplary embodiment, and the effect of the present disclosure can be applied to all electrodes including a plating layer subjected to the electroless Ni plating. Specifically, the effect of the present disclosure can be also applied to an electrode including a plating layer subjected to the electroless Ni plating, Pd plating, and Au flash plating, for example.

In the mounting structure of this exemplary embodiment, the BGA including the BGA electrode and the circuit board including the circuit board electrode are joined by the solder joining portion described above. The mounting structure having such a structural feature can satisfy the thermal fatigue resistance of the solder joining portion which is mounted on the circuit board.

As described above, the solder material and the mounting structure of the present disclosure can satisfy the thermal fatigue resistance even in the soldering to the BGA including the BGA electrode which is subjected to the electroless Ni plating. Therefore, the solder material and the mounting structure of the present disclosure are useful in a BGA ball for joining a terminal of an on-board BGA component or the like in which the electric conduction is required to be ensured even in a high temperature environment such as in the engine room, for example.

What is claimed is:

1. A mounting structure comprising:
   a ball grid array (BGA) including a BGA electrode;
   a circuit board including a circuit board electrode; and
   a solder joining portion disposed on the circuit board electrode and connected to the BGA electrode,
   wherein the solder joining portion is consisting essentially of Cu having a content ratio in a range from 0.6 mass % to 1.2 mass %, inclusive, Ag having a content ratio in a range from 3.0 mass % to 4.0 mass %, In, and Sn,
   (1) in a case that the content ratio of Cu is in a range from 0.6 mass % to 0.91 mass %, inclusive, the content ratio of In is in a range from 5.3+0.5+(6−(1.55×Content Ratio of Cu+4.428)) mass % to 6.8−0.5+(6−(1.57×Content Ratio of Cu+4.564)) mass %, inclusive,
   (2) in a case that the content ratio of Cu is greater than 0.91 mass % and equal to or less than 1.0 mass %, the content ratio of In is in a range from 5.3+0.5+(6−(1.55×Content Ratio of Cu+4.428)) mass % to 6.8−0.5 mass %, and
   (3) in a case that the content ratio of Cu is greater than 1.0 mass % and equal to or less than 1.2 mass %, the content ratio of In is in a range from 5.3+0.5 mass % to 6.8−0.5 mass %, inclusive.

2. The mounting structure according to claim 1, further comprising:
   a Ni plating layer disposed on at least one of surfaces of the circuit board electrode and the BGA electrode,
   wherein a reacted layer on a connection interface between the Ni plating layer and the solder joining portion is a $(Cu_y,Ni_{1-y})_6Sn_5$ layer ($0 \leq y \leq 1$) containing Ni in $Cu_6Sn_5$.

* * * * *